US012805002B2

(12) United States Patent

Sung et al.

(10) Patent No.: US 12,805,002 B2

(45) Date of Patent: Nov. 17, 2026

(54) HEIGHT CONTROL IN NANOSHEET DEVICES

(71) Applicant: INTERNATIONAL BUSINESS MACHINES CORPORATION, Armonk, NY (US)

(72) Inventors: Min Gyu Sung, Latham, NY (US); Kangguo Cheng, Schenectady, NY (US); Julien Frougier, Albany, NY (US); Ruilong Xie, Niskayuna, NY (US); Chanro Park, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 572 days.

(21) Appl. No.: 17/943,751

(22) Filed: Sep. 13, 2022

(65) Prior Publication Data

US 2024/0088140 A1 Mar. 14, 2024

(51) Int. Cl.

| | |
|---|---|
| ***H10D 84/00*** | (2025.01) |
| ***H10D 30/01*** | (2025.01) |
| ***H10D 30/43*** | (2025.01) |
| ***H10D 30/67*** | (2025.01) |
| ***H10D 62/10*** | (2025.01) |
| ***H10D 62/832*** | (2025.01) |
| ***H10D 84/01*** | (2025.01) |
| ***H10D 84/03*** | (2025.01) |
| ***H10D 84/83*** | (2025.01) |

(Continued)

(52) U.S. Cl.

CPC ........... *H10D 84/83* (2025.01); *H10D 30/014* (2025.01); *H10D 30/43* (2025.01); *H10D 30/6735* (2025.01); *H10D 62/121* (2025.01); *H10D 62/832* (2025.01); *H10D 84/0128* (2025.01); *H10D 84/0151* (2025.01); *H10D 84/038* (2025.01); *H10P 14/3411* (2026.01); *H10P 14/3462* (2026.01); *H10P 50/242* (2026.01); *H10P 74/238* (2026.01)

(58) Field of Classification Search

CPC .. H10D 84/83; H10D 84/832; H10D 30/6735; H10D 62/121

See application file for complete search history.

(56) References Cited

U.S. PATENT DOCUMENTS

| | | | |
|---|---|---|---|
| 9,117,877 | B2 | 8/2015 | Cai et al. |
| 9,236,308 | B1 | 1/2016 | Sung et al. |

(Continued)

*Primary Examiner* — Reema Patel

(74) *Attorney, Agent, or Firm* — Harrity & Harrity, LLP

(57) ABSTRACT

A semiconductor device including a substrate having a dense array region and an isolation region. The semiconductor device includes plurality of first fin structures of stacked nanosheets is present in the dense array region separated by a single pitch, wherein each fin structure in the first plurality of fin structures has a same first nanosheet height as measured from an upper surface of the substrate in the dense array region. The semiconductor device further includes at least one second fin structure of stacked nanosheets is present in the isolation region, wherein a number of second fin structure in the isolation region is less than a number of first fin structures in the dense array region, the at least one fin structure having a second nano sheet height that is measured from the upper surface of the substrate in the isolation region that is the same as the first nanosheet height.

20 Claims, 10 Drawing Sheets

(51) Int. Cl.

| | |
|---|---|
| ***H10P 14/20*** | (2026.01) |
| ***H10P 50/24*** | (2026.01) |
| ***H10P 74/00*** | (2026.01) |

(56) References Cited

U.S. PATENT DOCUMENTS

| | | | | |
|---|---|---|---|---|
| 10,236,291 | B2 | 3/2019 | Sung et al. | |
| 10,510,610 | B2 | 12/2019 | Sung et al. | |
| 10,665,514 | B2 | 5/2020 | Song et al. | |
| 10,770,361 | B2 | 9/2020 | Song et al. | |
| 2008/0012879 | A1 | 1/2008 | Clodfelter | |
| 2008/0128797 | A1 | 6/2008 | Dyer et al. | |
| 2013/0181263 | A1 | 7/2013 | Cai et al. | |
| 2017/0365604 | A1* | 12/2017 | Suh | H10D 84/85 |
| 2021/0375858 | A1* | 12/2021 | Chiang | H10D 30/6735 |

* cited by examiner

HEIGHT CONTROL IN NANOSHEET DEVICES

BACKGROUND

The present disclosure relates to semiconductor devices, and more particularly to semiconductor devices including channel regions integrated within nanosheets.

With the continuing trend towards miniaturization of integrated circuits (ICs), there is a need for transistors to have higher drive currents with increasingly smaller dimensions. The use of non-planar semiconductor devices such as, for example, nano-sheet transistors may be the next step in the evolution of complementary metal oxide semiconductor (CMOS) devices. However, vertical devices having nanosheet integrated channels into multiple regions structures have shown some susceptibility to variations in height during processing.

SUMMARY

In one aspect, a semiconductor device is provided including fin structures composed of stacked nanosheets. In one embodiment, the semiconductor device includes a substrate having a dense array region and an isolation region, wherein the dense array region and the isolation region are separated by a trench isolation region. The semiconductor device includes plurality of first fin structures composed of stacked nanosheets is present in the dense array region separated by a single pitch, wherein each fin structure in the first plurality of fin structures has a same first nanosheet height as measured from an upper surface of the substrate in the dense array region. The semiconductor device further includes at least one second fin structure including of stacked nanosheets is present in the isolation region, wherein a number of second fin structure in the isolation region is less than a number of first fin structures in the dense array region, the at least one fin structure having a second nanosheet height that is measured from the upper surface of the substrate in the isolation region that is the same as the first nanosheet height.

In another aspect, an electrical device is provided having field effect transistors including channel regions present in fin structures of stacked nanosheets. In one embodiment, the electrical device includes a substrate having a dense array region and an isolation region, wherein the dense array region and the isolation region are separated by a trench isolation region. The electrical device includes a plurality of first field effect transistors having channel regions present in a first plurality of first fin structures of stacked nanosheets is present in the dense array region separated by a single pitch. Each first fin structure has a same first fin height as measured from an upper surface of the substrate in the dense array region. The electrical device also at least one second field effect transistor having channel regions present in at least one second fin structure that includes stacked nanosheets is present in the isolation region. The number of second fin structure in the isolation region is less than a number of first fin structures in the dense array region. The at least one second fin structure having a second fin height that is measured from the upper surface of the substrate in the isolation region that is the same as the first fin height.

In another aspect a method of providing fin structures composed of nanosheets is provided. In one embodiment, the method includes etching a stack of nanosheets with a single pitch pattern to provide a plurality of fin structures on a substrate, wherein etching of a base nanosheet in the stack of nanosheets that is in direct contact with the substrate employs an etch process that is selective to the substrate. The method may further include forming first spacers on sidewalls of the plurality of fin structures; and forming first depth trenches in the substrate using the fin structures and first spacers as a mask, wherein the spacer protect a portion of the substrate adjacent to the plurality of fin structures to provide a step profile during etch processes in forming the first depth trenches. The method can also include forming a protective liner on the plurality of fin structures; and forming a second depth trench in the substrate. In some embodiments, the etch process for forming the second depth trench defines a dense array of fin structures from the plurality of fin structures in a dense array region of the substrate and isolation fin structures from the plurality of fin structures in an isolation region of the substrate, the isolation region and dense array region being separated from one another by the second depth trench. In some embodiments, the protective liner protects the dense array of fin structures and the isolation fin structures during etch processes for forming the second depth trench to provide that the fin height for the dense array of fin structures and the isolation fin structures is the same.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION

Figure 1A:
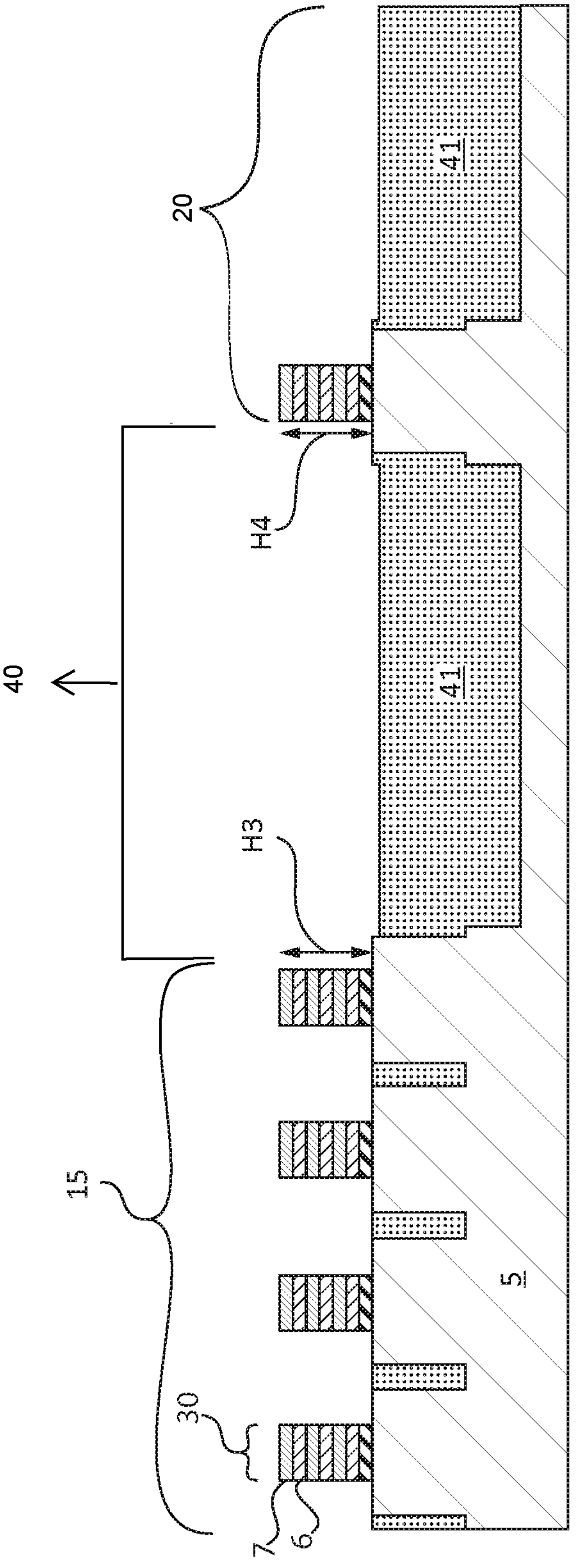
FIG. 1A is a side cross-sectional view of a fin structures for a nanosheet device that have been formed using a process flow providing that each of the fin structures has the same fin height of their neighboring fin structures, in accordance with one embodiment of the present disclosure.

Detailed embodiments of the claimed methods, structures and computer products are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment. For purposes of the description hereinafter, the terms "upper", "over", "overlying", "lower", "under", "underlying", "right", "left", "vertical", "horizontal", "top", "bottom", and derivatives thereof shall relate to the embodiments of the disclosure, as it is oriented in the drawing figures. The term "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In one aspect, embodiments of the present disclosure describe structures and methods of forming nanosheet devices that have been processed to overcome active nanosheet height variation. The nanosheet devices are patterned into fin type geometries. In multiple region devices, e.g., devices formed on substrates including multiple active device and isolation regions, it has been determined that at least three reasons can be contributing to activate nanosheet height variation between the array device and the isolated devices. One possible reason for the active nanosheet height variation can result from differences in the quality of the oxide, e.g., silicon oxide ($SiO_2$), in the isolation regions and the densely populated array regions. Another reason is the difference in the recess rate of oxide, e.g., silicon oxide ($SiO_2$), between the regions of the device in which there are isolated devices, and the regions of the device in which there are dense arrays of devices. Finally, there can be depth variations that result from the subtractive processing, e.g., reactive ion etching (RIE), that provides the fins of nanosheets.

It has been determined that to provide for a more uniform height of the patterned fins of nanosheets (NS), the shallow trench isolation (STI) recess should be stopped at the bottom of the bottom dielectric isolation (BDI) layer that is underlying the nanosheet stacks. This is generally where variations in STI recessing steps have occurred. Such that, the recess to be stopped below the BDI to get a process margin in BDI recess. Under this situation, PC aspect ratio on STI are has to increase, which is vulnerable to collapse.

The methods and structures of the present disclosure are now described with reference to FIGS. 1A-9.

FIG. 1A illustrates one embodiment of a semiconductor device including fin structures 30 composed of stacked nanosheets 6, 7 on a shared semiconductor substrate 5, in which each of the fin structures 30 in the depicted dense array regions 15 and isolation regions 20 have a same fin height H3, H4. In one embodiment, the semiconductor device includes a substrate 5 having a dense array region 15 and an isolation region 20. The dense array region 15 and the isolation region 20 are separated by a trench isolation region 40 comprising a dielectric fill 41. The trench isolation region 40 is disposed between and distinct from the dense array region 15 and the isolation region 20. The semiconductor device includes a plurality of first fin structures 30 composed of stacked nanosheets 6, 7 that is present in the dense array region 15 separated by a single pitch, wherein each fin structure 30 in the first plurality of fin structures has a same first fin height H3 as measured from an upper surface of the substrate 5 in the dense array region 15. The semiconductor device further includes at least one second fin structure 30 including of stacked nanosheets 6, 7 that is present in the isolation region 20. The number of second fin structures 30 in the isolation region 20 is less than a number of first fin structures 30 in the dense array region 15. For example, FIG. 1A illustrates only one fin structure 30 being present in the isolation region 20. The at least one fin structure 30 in the isolation region 20 has a second fin height H4 that is measured from the upper surface of the substrate 5. The second fin height H4 for the fin structures 30 in the isolation region 20 is the same as the first fin height H3 for the fin structures 30 in the dense array region 15. In some embodiments, the upper surface of the substrate 5 in the dense array region 15 is coplanar with the upper surface of the substrate 5 in the isolation region 20. Previously, there would be variations in fin height.

Figure 1B:
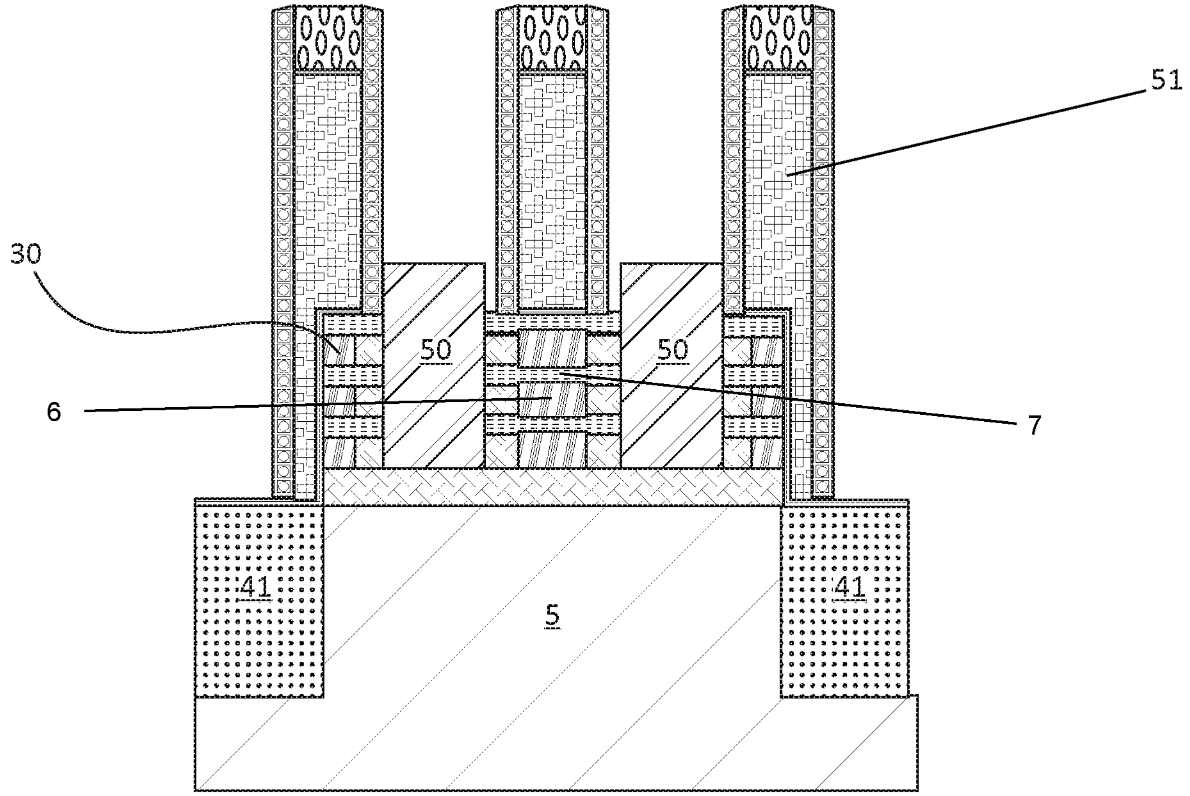
FIG. 1B is a side cross-section view that is perpendicular to the view illustrated in FIG. 1A, which further illustrates the positioning of gate structures and source/drain regions relative to the fin structures depicted in FIG. 1A.

In some embodiments, the plurality of first fin structure 30 in the dense array region 15 and the fin structure 30 in the isolation region 20 further comprise a gate structure 51 and source and drain regions (source/drain regions 50), as depicted in FIG. 1B. The stacked nanosheets 6, 7 in the plurality of first fin structures 30 includes a first nanosheet 6 having a first silicon and germanium composition, and a second nanosheet 7 having a second silicon and germanium composition, wherein a germanium content of the first silicon and germanium composition is different from a germanium content of the second silicon and germanium composition. In some embodiments, the substrate 5 is composed of silicon (Si).

One example of a method for forming the structure depicted in FIGS. 1A and 1B is now described with reference to FIGS. 2-9.

Figure 2:
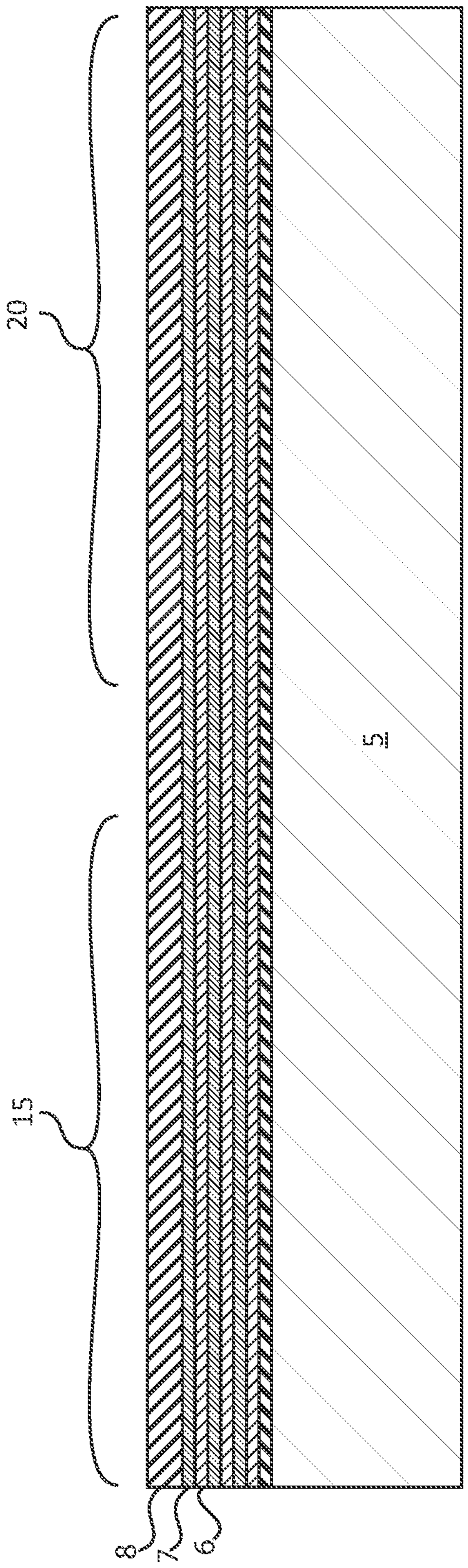
FIG. 2 is a side cross-sectional view of an initial structure including a nano sheet stack that may be employed in method that provides for precise nanosheet active height control with a step profile.

FIG. 2 illustrates one embodiment of an initial structure that may be employed in method that provides for precise nanosheet active height control with a step profile. FIG. 2 illustrates one embodiment of a nanosheet stack 10 being formed atop a supporting substrate 5. The structure depicted in FIG. 2 may include a region of the substrate 5 for a dense array of devices, i.e., dense array region 15, and a region of the substrate 5 for isolated device, i.e., isolation region 20.

The substrate 5 may be composed of a supporting material, such as a semiconductor material, e.g., silicon, or dielectric material, such as silicon oxide or silicon nitride.

The stack of nanosheets 10 is a multilayered structure that is present on the upper surface of the substrate 5. The term "nanosheet" denotes a substantially two dimensional structure with thickness in a scale ranging from 1 to 100 nm. The width and length dimensions of the nanosheet may be greater than the width dimensions. In the embodiment depicted in FIG. 1A, the stack of nanosheets includes a repeating sequence of two nanosheets 7, 8 having different compositions.

For example the layered semiconductor materials that provide the nanosheet stack 10 can includes alternating semiconductor layers 7, 8 in the following sequence: $Si_{1-x}Ge_x/Si_{1-y}Ge_y$ with two different Ge contents. For example, in the above chemical compositions the value of x may be more than the value of y. For example, the value of y can be approximately 30%, and the value of x can be approximately 55%.

In addition to the above example, any type IV semiconductor composition combination and/or III-V semiconductor composition combination is suitable for use with the stacks of layered semiconductor materials 7,8 that provide the nanosheets. For example, the compositions selected for the layers within the stacks of layered semiconductor materials 7, 8 can include Si, SiGe, SiGeC, SiC, single crystal Si, polysilicon, i.e., polySi, epitaxial silicon, i.e., epi-Si, amorphous Si, i.e., α:Si, germanium, gallium arsenide, gallium nitride, cadmium telluride and zinc sellenide.

The stack of the layered semiconductor materials for the nanosheets 7, 8 may be formed using a deposition process, such as epitaxial deposition. "Epitaxial growth and/or deposition" means the growth of a semiconductor material on a deposition surface of a semiconductor material, in which the semiconductor material being grown has substantially the same crystalline characteristics as the semiconductor material of the deposition surface. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

The thickness of each layer within the stack of the layered semiconductor materials for the nanosheets 7, 8 may range from 1 nm to 30 nm. In another embodiment, the thickness of each layer within the stack of the layered semiconductor materials 10 may range from 5 nm to 20 nm.

The methods and structures are not limited to only the example depicted in FIG. 1A. For example, the number of repetitions of the above described sequence of semiconductor materials in the stack may also be equal to 3, 4, 5, 10, 15 and 20, as well as any value between the aforementioned examples.

Still referring to FIG. 2, in some embodiments, a hardmask layer 8 may be formed atop the stack of nanosheets 10. The hardmask is used for patterning the stack of nanosheets 10. In some embodiments, the hardmask layer 8 may be composed of a nitride, such as silicon nitride.

Figure 3:
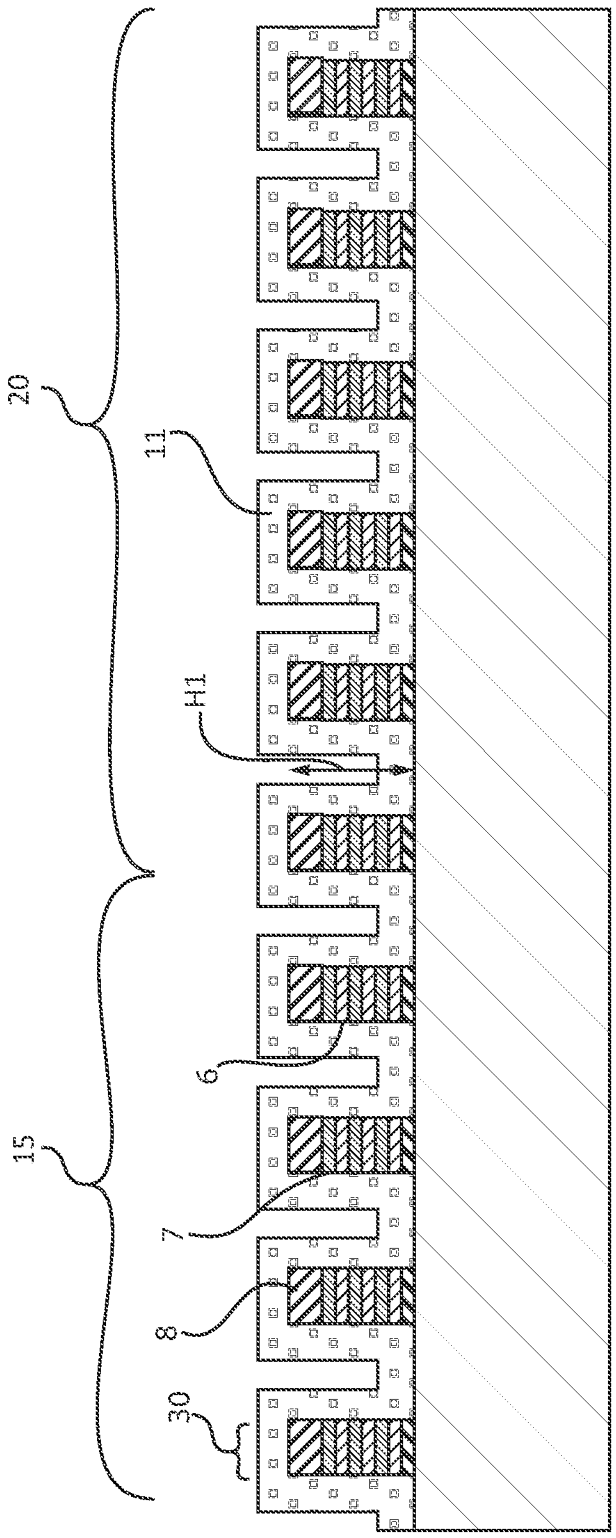
FIG. 3 is a side cross-sectional view illustrating one embodiment of patterning the stack of nanosheets that was depicted in FIG. 2, and forming a conformal dielectric layer for spacer formation on the sidewalls of the fins that are formed by patterning the stack of nanosheets.

FIG. 3 depicts one embodiment of patterning the stack of nanosheets 10 that was depicted in FIG. 2. The stack of nanosheets 10 may be patterned into a plurality of fin structures 30. In some embodiments, the patterning step depicted in FIG. 3 employs a single pattern active area (Rx) pitch. The stack of nanosheets 10 is patterned to provide a plurality of fin structures 30 in the dense region 15 and the isolation region 20 of the substrate 5. The pattern for the dense region 15 and the isolation region 20 is formed at the same time photolithography. Following formation of the photoresist mask, the hardmask layer 8 may be etched, wherein the etched hardmask layer 8 provides as pattern for etching the underlying nanosheet stack 10. As noted a "single pitch" is used for all the fin structures that patterned. The "pitch" is the center to center distance separating to repeating structure. The height H1 of the fin structures 30 extends from bottom surface of the dielectric cap layer 6 to the surface of the first nanosheet 6 that is in direct contact with the upper surface of the substrate 5.

For example, a pattern (not shown) is produced by applying a photoresist to the surface to be etched (e.g., the hardmask layer 8); exposing the photoresist to a pattern of radiation; and then developing the pattern into the photoresist utilizing conventional resist developer. Once the patterning of the photoresist is completed, the sections of the nanosheet stack 10 covered by the photoresist are protected while the exposed regions are removed using a selective etching process that removes the unprotected regions.

In some embodiments, in which the substrate 5 is composed of a semiconductor material, such as silicon (Si), the etch process may remove the exposed portions of the nanosheet stack 10 selectively to the substrate 5. In one example, the first layer 6 of the nanosheet stack 10 that is in direct contact with the upper surface of the semiconductor substrate 5 is silicon germanium (SiGe) having a germanium (Ge) content on the order of 55 wt. % and the substrate 5 is silicon (Si), the etch process for patterning the fins may remove the first layer 6 of the nanosheet stack 10 selectively to the substrate. For example, end point detection may be employed to sense when the etch process has etched through the first layer 6 of silicon germanium (SiGe), and to stop when the etch process has reached the semiconductor substrate of silicon (Si). The etch process may be a chemical etch, such as a wet chemical etch. In some embodiments, the etch process may be a directional etch, such as reactive ion etching (RIE). In some embodiments, by employing end point detection, and terminating the etch process when it has been detected that the upper surface of the substrate 5 has been exposed, height variations resulting from etching the substrate 5 can be eliminated. It is noted that the height H1 of the fin structures 30 formed of the patterned layer of nanosheets 10 can be set at this stage of the process flow.

FIG. 3 also depicts forming a conformal dielectric layer 11 for spacer formation on the sidewalls of the fins 30 that are formed by patterning the stack of nanosheets. The term "conformal" denotes a layer having a thickness that does not deviate from greater than or less than 30% of an average value for the thickness of the layer. The conformal dielectric layer 11 may be blanket deposited to be on the upper and sidewall surfaces of the fin structures 30, and may be present on the upper surface of the substrate 5 between adjacent fin structures 30. The conformal dielectric layer 10 may be an oxide, nitride or oxynitride material. In one example, the conformal dielectric layer 11 is composed of silicon oxide.

The conformal dielectric layer 11 may be deposited using a conformal deposition process, such as chemical vapor deposition, such as plasma enhanced chemical vapor deposition or metal organic chemical vapor deposition. The conformal dielectric layer 11 may also be deposited using atomic layer deposition (ALD).

Figure 4:
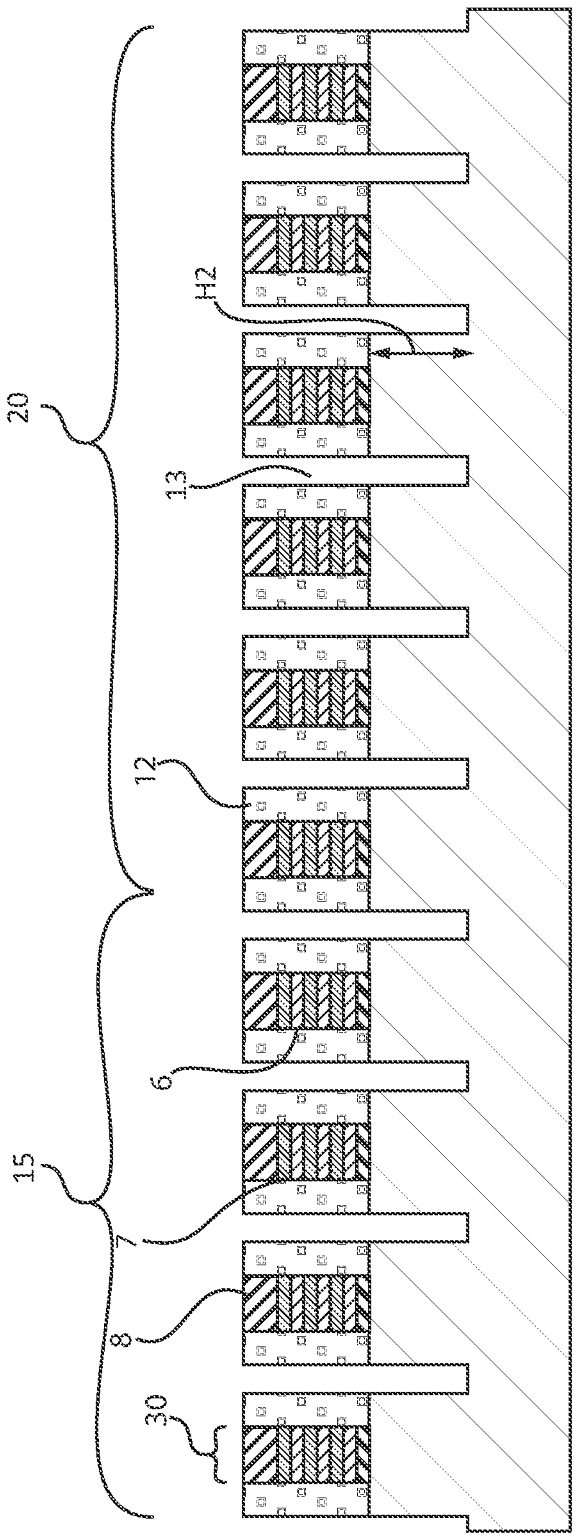
FIG. 4 is a side cross-sectional view illustrating etching the substrate using the plurality of fins and spacers as an etch mask, in which the trenches formed provide a step profile for the substrate portions underlying the fin structures, in accordance with one embodiment of the present disclosure.

Following deposition of the conformal dielectric layer 11, a directional etch may be applied to recess the height of the conformal dielectric layer 11. The directional characteristic of the etch process can allow for the horizontal portions of the conformal dielectric layer 11 to be completely removed, where the vertical portions remain to provide spacers, as depicted in FIG. 4. The directional etch process may be reactive ion etching (RIE).

FIG. 4 also depicts one embodiment of etching the substrate to provide trenches 13 positioned in the portions of the substrate separating adjacent fin structures 30. The etch process depicted in FIG. 4 may employ a directional etch, such as reactive ion etching, and may employ the plurality of fins 30 and spacers 12 as an etch mask. The etch process depicted in FIG. 4 illustrates forming trenches 13 that are horizontally offset from the sidewalls of the fins 30 of the layered nanosheets. The etch process depicted in FIG. 4 can provide a step profile for the substrate portions 5 underlying the fin structures 30. By forming the trenches 13 in portions of the substrate that are separate from the portions directly under the fin structures 30, the etch process being depicted in FIG. 4 does not impact the structure to provide for variations in the height of the fin structures 30 composed of the nanosheets 6, 7.

Figure 5:
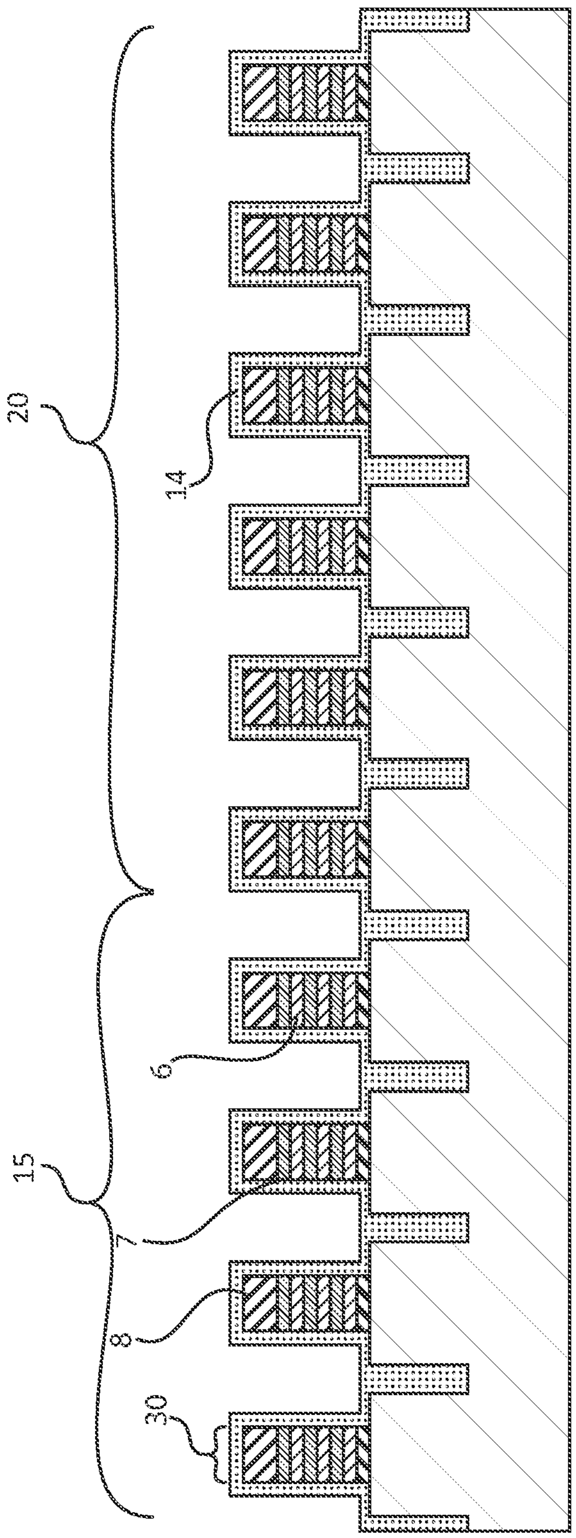
FIG. 5 is a side cross-sectional view illustrating removing the sidewall spacers from the fin structures depicted in FIG. 3, and depositing a conformal dielectric liner on the fin structures of layered nanosheets depicted in FIG. 3, wherein the conformal dielectric line fills the trenches, in accordance with one embodiment of the present disclosure.

FIG. 5 depicts one embodiment of removing the sidewall spacers 12 from the fin structures depicted in FIG. 3, and depositing another conformal dielectric liner 14 on the fin structures of layered nanosheets depicted in FIG. 3. Removing the sidewall spacers 12 may be performed using a selective etch process. As used herein, the term “selective” in reference to a material removal process denotes that the rate of material removal for a first material is greater than the rate of removal for at least another material of the structure to which the material removal process is being applied. For example, etch process may remove the material of the sidewall spacer 12 selectively to the semiconductor material of the nanosheets 6, 7, the dielectric cap 8 and the substrate 5. The etch process for removing the spacers 12 may be a wet etch, or a dry etch, e.g., reactive ion etching and/or plasma etch.

FIG. 5 further depicts depositing the conformal dielectric layer 14 for filling the trenches 13. The conformal dielectric layer 14 also be referred to as conformal fill layer 14. The conformal fill liner 14 may be deposited to a thickness that fills the trenches 13. The trenches 13 have a smaller trench critical dimension that is selected to allow for the conformal dielectric layer 14 to fill the trench 13, and pinch off the opening to the trench 13. The conformal fill layer 14 is deposited using a conformal deposition process that is blanked deposited on the entirety of the structure depicted in FIG. 4 after removing the sidewall spacer 12. The conformal fill layer 14 is formed on the fins 20, e.g., the sidewall and upper surfaces of the fins, and on the exposed upper surfaces of the substrate 5, e.g., the step profile portions, as well as being formed in and filling the trenches 13. The smaller trench critical dimension on the shallow trench isolation (STI) region allows for the conformal fill layer 14 to pinch off the trench 13. The conformal fill layer 14 may be composed of a dielectric material. For example, the conformal fill layer 14 may be an oxide, such as silicon oxide ($SiO_2$). The STI fill depth height is constant this step of the process flow.

Figure 6:
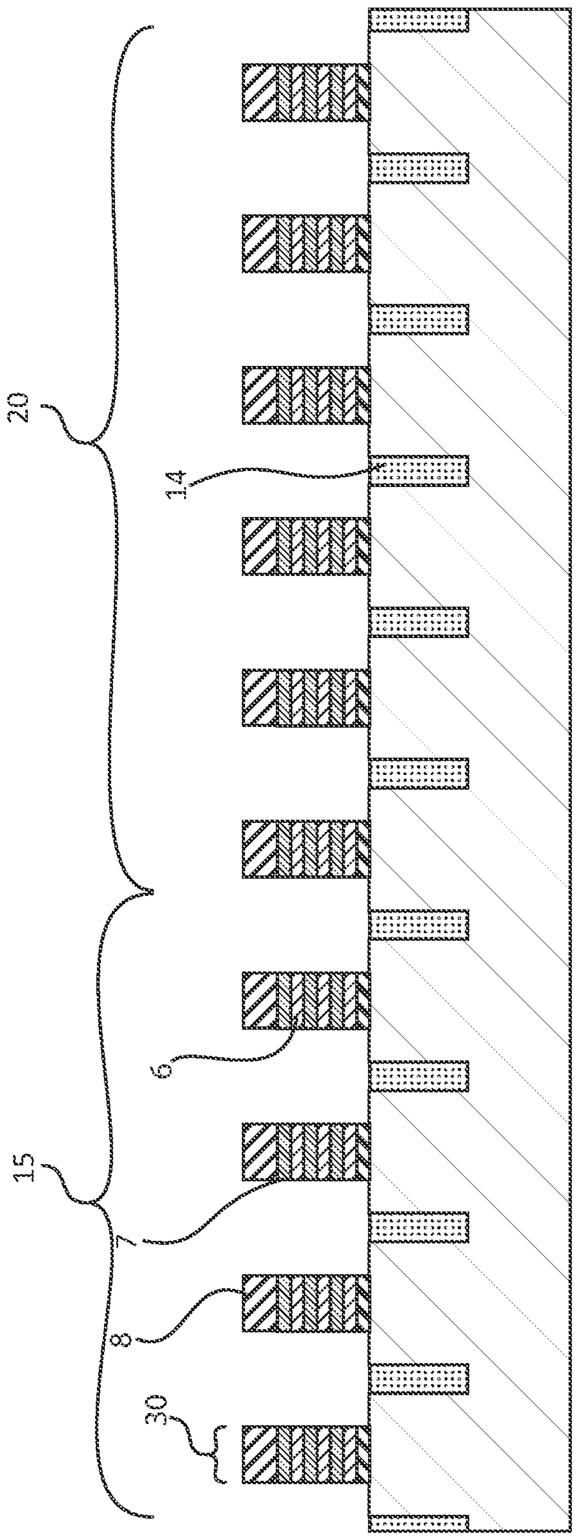
FIG. 6 is a side cross-sectional view depicting one embodiment of an etch back process step that is applied to the conformal dielectric liner that filled the trenches between adjacently positioned fin structures of stacked nanosheets.

FIG. 6 depicts one embodiment of an etch back process step that is applied to the conformal fill layer 14 that filled the trenches 13 between adjacently positioned fin structures 30 of stacked nanosheets 6, 7. In the embodiments, in which the conformal fill layer 14 is composed of an oxide, such as silicon oxide ($SiO_2$), the etch back process may be selective to the silicon (Si) substrate 5 and the silicon germanium (SiGe) compositions of the nanosheets 6, 7 in the stack that provides the fins 30. The etch process may be directional or non-directional or a combination thereof. The etch process may be timed to ensure that the portion of the conformal fill layer 14 that is present in the trenches 13 is not removed. The etch process may be a wet chemical etch, plasma etch or reactive ion etch process.

Figure 7:
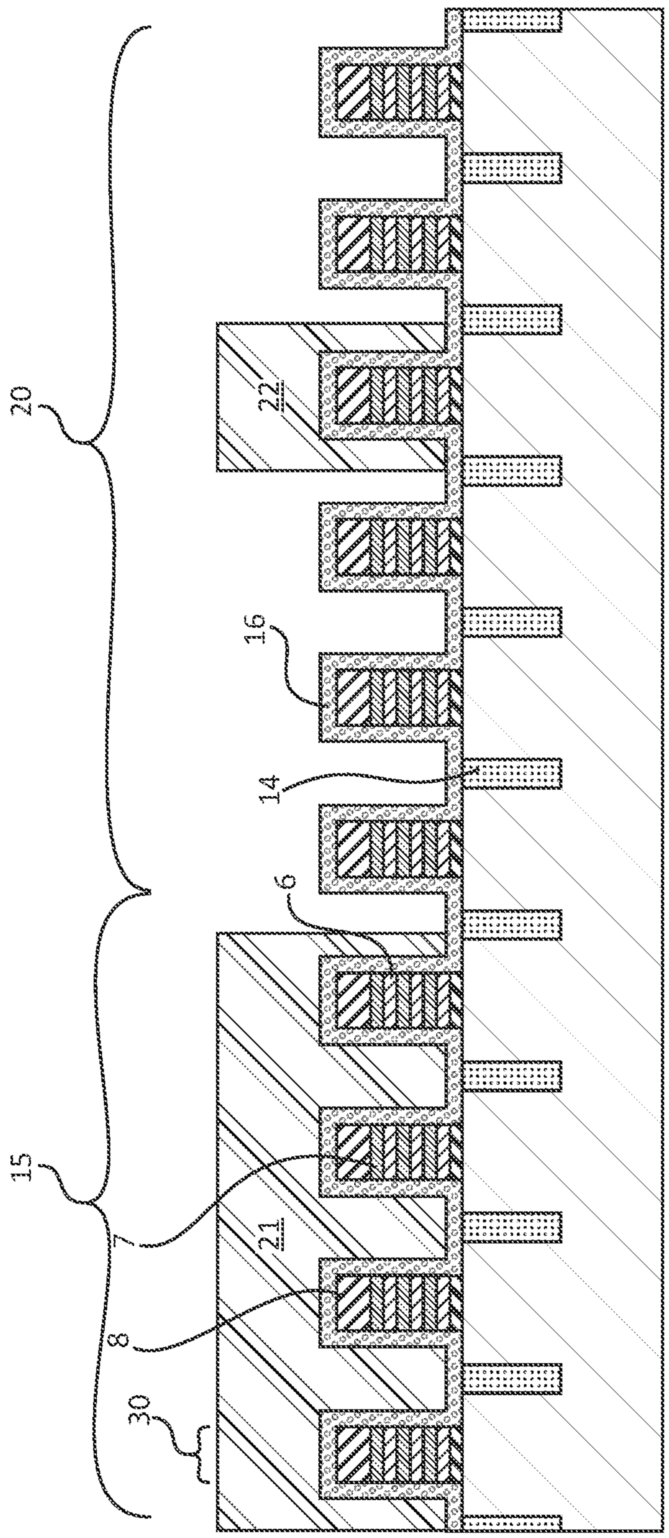
FIG. 7 is a side cross-sectional view illustrating pattering the structure depicted in FIG. 6 to further define the array region and isolation region.

FIG. 7 illustrating pattering the structure depicted in FIG. 6 to further define the array region 15 and isolation region 20. In some embodiments, before patterning, a protective liner 16 is blanket deposited over the structure that is depicted in FIG. 6. The protective liner 16 may be composed of a nitride, such as silicon nitride. The protective liner 16 may be deposited on the sidewalls and upper surfaces of the fins 30 of nanosheets 6, 7, as well as the portions of the substrate 5 separating the fins 30. The protective liner 16 is formed in both the array region 15 and the isolation region 20. The protective liner 16 may have a conformal thickness, e.g., be a conformally deposited layer. The protective liner 16 may be deposited using a conformal deposition process, such as chemical vapor deposition, such as plasma enhanced chemical vapor deposition or metal organic chemical vapor deposition. The protective liner 16 may also be deposited using atomic layer deposition (ALD).

In some embodiments, following formation of the protective liner 16, the method may begin the process sequence for forming the blocks masks that provide for further defining the array region 15 and the isolation region 20. The block masks 21, 22 are formed having a first portion 21 protecting a plurality of fins 30 of nanosheets 6, 7 in the dense array region 15, and having a second portion 22 protecting a single fin 30 in the isolation region 20, wherein a remainder of fins of nanosheets 6, 7 are exposed. The exposed portion of the substrate that is not protected by the block mask 71 is subsequently processed to remove the fin structures 30 from the isolation region 20, but for the fin structures 30 protected by the second portion of the block mask 21, 22.

The block mask 21, 22 may comprise soft and/or hardmask materials and can be formed using deposition, photolithography and etching. In one embodiment, the block mask 21, 22 comprises an organic planarization layer (OPL). A block mask 21, 22 comprising a OPL material may be formed by blanket depositing a layer of OPL material; providing a patterned photoresist atop the layer of OPL material; and then etching the layer of POL material to provide a block mask 21, 22.

Following the formation of the block mask 21, 22, an etch process is performed removing the exposed portion of the protective liner 16, the exposed fin structure 30, and the underlining portion of the substrate 5 to provide isolation trenches 40. In one embodiment, a directional etch process, such as reactive ion etching (RIE), may be employed to etch through the exposed portions of the protective liner 16, the fin structure 30 and the substrate 5.

Figure 8:
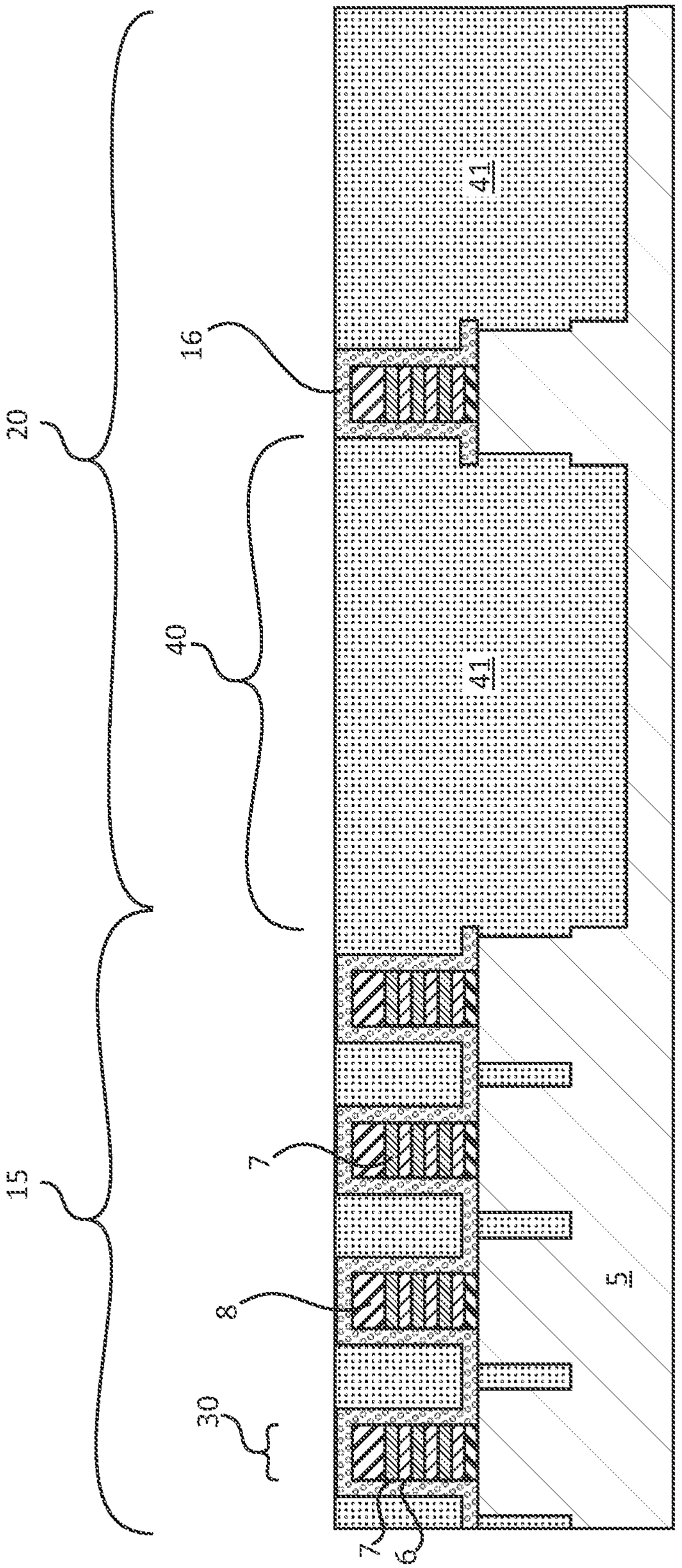
FIG. 8 is a side cross-sectional view depicting etch and fill process using the patterning illustrated in FIG. 7 for further defining the contents of the array region and the isolation region of the substrate, in accordance with one embodiment of the present disclosure.

FIG. 8 depicts etch and fill process using the patterning illustrated in FIG. 7 for further defining the contents of the array region 15 and the isolation region 20 of the substrate 5. First, following the formation of the isolation trenches 40, the block mask 21, 22 may be stripped. In a following process step, the isolation trenches 40 may be filled. For example, using flowable chemical vapor deposition (FCVD) an oxide, such as silicon oxide, may be deposited to fill the isolation trenches 40. Following deposition, a planarization process may be applied to provide that the upper surface of the fill 41 for the isolation trenches 40 is coplanar with the upper surface of the portion of the protective liner 16 that is present on the dielectric cap 8 of the fin structures 30. The planarization process may be chemical mechanical planarization (CMP).

Figure 9:
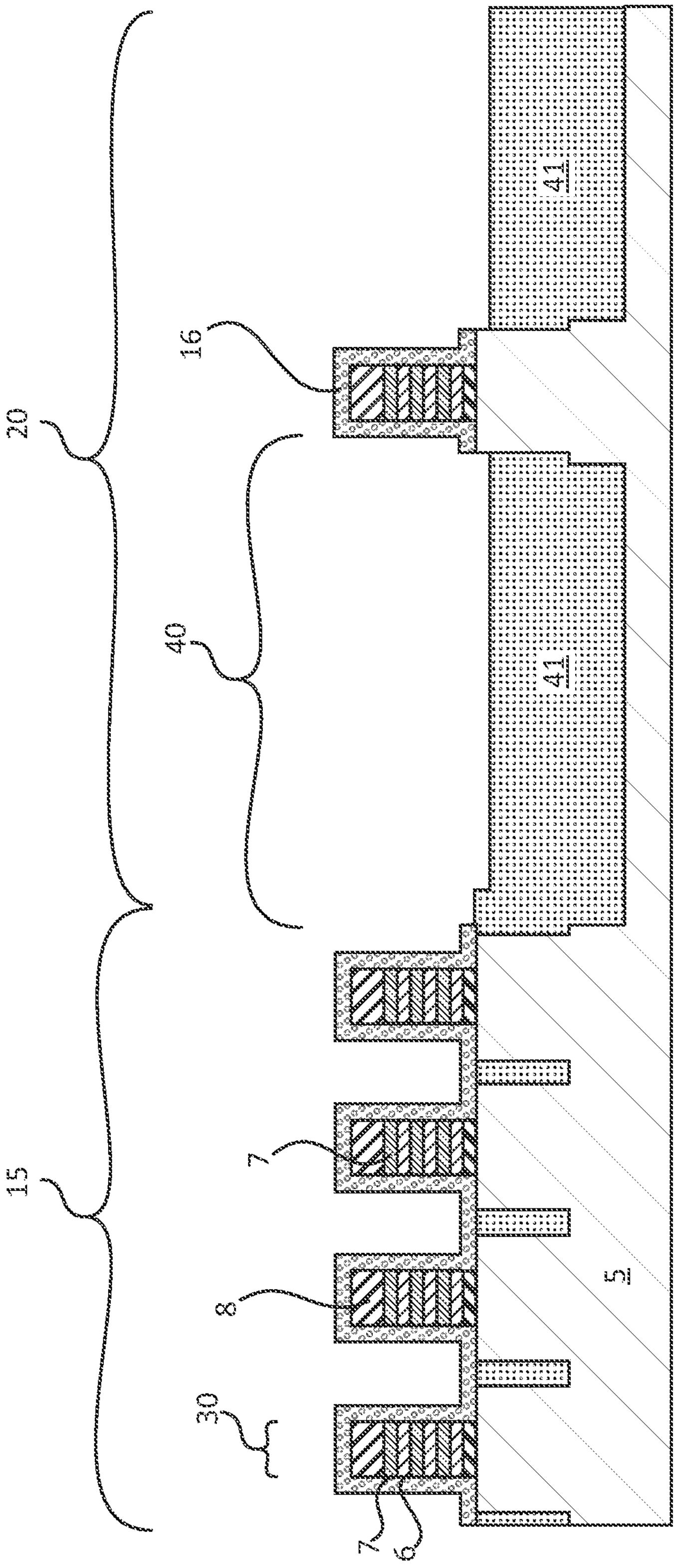
FIG. 9 illustrates is a side cross-sectional view illustrating recessing the dielectric fill formed in the trenches depicted in FIG. 7.

FIG. 9 illustrates one embodiment of recessing the dielectric fill 41 formed in the trenches 40 depicted in FIG. 8. The dielectric fill 41 may be recessed using an etch that is selective to the protective liner 16. In this manner, recessing the dielectric fill 41 will not impact the fin height relative to the upper portions of the substrate 5 for either the array region 15 and the isolation region. The protective liner 16 protects both the fin structures 30 and the surface of the substrate 5 during the etch processes for receiving the dielectric fill 41. For example, when the dielectric fill 41 for the isolation trenches 40 is composed of silicon oxide (SiO2) and the protective liner 16 is a nitride, such as silicon nitride, the etch process for recessing the dielectric fill 41 may remove the oxide material selectively to the nitride material. The etch process used in this stage of the process flow may be a directional etch, such as reactive ion etching (RIE). The etch process may also be a wet chemical etch.

Referring back to FIG. 1A, in a following process sequence, the protective liner 16 may be removed from the dense array region 15 and the isolation region 10. In some embodiments, the protective liner 16 is composed of a nitride, such as silicon nitride, and the substrate 5 is composed of silicon (Si), the protective liner 16 may be removed by an etch that removes nitride material selectively to silicon. The etch process may be a directional etch, i.e., anisotropic etch process. The term "anisotropic etch process" denotes a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present disclosure include ion beam etching, plasma etching or laser ablation. In other embodiments, the etch process for removing the protective liner 16 may be an isotropic etch process. By "isotropic" it is meant that the etch process is non-directional. In one embodiment, an isotropic etch, such as a plasma etch or wet chemical etch, may be employed to remove the protective liner 16.

Following removal of the protective liner 16, the dielectric cap 8 on the fin structures 30 can be removed. The dielectric cap 8 is composed of a nitride, such as silicon nitride. In some embodiments, the nitride material of the dielectric cap 8 may be removed by an etch that is selective to the underlying semiconductor material of the nanosheets 6, 7 that provide the fin 30. In some embodiments, the fin is composed of silicon germanium (SiGe) nanosheets. The nitride material of the dielectric cap may be removed selectively to the silicon germanium of the fin structures 30 using a selective etch, such as a plasma etch or wet chemical etch. Alternatively, a planarization process may remove the dielectric cap 8, such as chemical mechanical planarization.

FIG. 1A illustrates a semiconductor substrate including two regions 15, 20 of different density fin structures 30, in which the fin height H2, H3 for both regions is the same. The dense array region 15 includes a plurality of fins 30. The height H3 of each of the fins 30 in the dense array region is the same. Although only four fins 30 of nanosheets 6, 7 are depicted in the dense array region 15, the present disclosure is not limited to only this example. Any number of fins 30 may be present in the dense array region 15.

The fin structures 30 depicted in FIG. 1A may be further processed to provide field effect transistors (FETs), in which the channel of the field effect transistors is present in the nanosheets 6, 7. As used herein, the term "channel" is the region underlying the gate structure and between the source and drain of a semiconductor device that becomes conductive when the semiconductor device is turned on. In some embodiments, source and drain regions are formed on opposing sides of the channel, and a gate structure is formed in direct contact with the channel. A "gate structure" means a structure used to control output current (i.e., flow of carriers in the channel) of a semiconducting device, such as a field effect transistor (FET), e.g., nanosheet device.

In some embodiments, the gate structure and source and drain regions for the device are formed using a replacement gate process flow. By "replacement" it is meant that the structure is present during processing of the semiconductor device, but is removed from the semiconductor device prior to the device being completed. As used herein, the term "replacement gate structure" denotes a sacrificial structure that dictates the geometry and location of the later formed functioning gate structure. The "functional gate structure" operates to switch the semiconductor device from an "on" to "off" state, and vice versa.

In one embodiment, a sacrificial material that provides the replacement gate structure is first formed on the channel region of the fin structures 30. Following the formation of the replacement gate structure, the source and drain regions may be formed. For example, epitaxial semiconductor material may be formed on the source and drain region portions of the nanosheets 6, 7 following the formation of the replacement gate structure.

As used herein, the term "drain" means a doped region in semiconductor device located at the end of the channel region, in which carriers are flowing out of the transistor through the drain. The term "source" is a doped region in the semiconductor device, in which majority carriers are flowing into the channel region.

In some embodiments, the epitaxial semiconductor material for the source and drain regions may be composed of silicon (Si), germanium (Ge), silicon germanium (SiGe), silicon doped with carbon (Si:C) or the epitaxial semiconductor material 35 may be composed of a type III-V compound semiconductor, such as gallium arsenide (GaAs).

The epitaxial semiconductor material for the source and drain regions may be in situ doped to a p-type or n-type conductivity. The term "in situ" denotes that a dopant, e.g., n-type or p-type dopant, is introduced to the base semiconductor material, e.g., silicon or silicon germanium, during the formation of the base material. For example, an in situ doped epitaxial semiconductor material may introduce n-type or p-type dopants to the material being formed during the epitaxial deposition process that includes n-type or p-type source gasses. In the embodiments in which the semiconductor device being formed has p-type source and drain regions, and is referred to as a p-type semiconductor device, the doped epitaxial semiconductor material is doped with a p-type dopant to have a p-type conductivity. As used herein, "p-type" refers to the addition of impurities to an intrinsic semiconductor that creates deficiencies of valence electrons. In a type IV semiconductor, such as silicon, examples of p-type dopants, i.e., impurities, include but are not limited to, boron, aluminum, gallium and indium. As used herein, “n-type” refers to the addition of impurities that contributes free electrons to an intrinsic semiconductor. In a type IV semiconductor, such as silicon, examples of n-type dopants, i.e., impurities, include but are not limited to antimony, arsenic and phosphorous.

In some instances, following the formation of the source and drain regions, an interlevel dielectric layer is deposited. Following the deposition of the interlevel dielectrics, the replacement gate structures can be replaced with functional gate structures. The functional gate structures operates to switch the semiconductor device from an “on” to “off” state, and vice versa. The functional gate structures typically include at least one gate dielectric and at least gate conductor. The replacement gate structures are typically removed using a selective etch process that provides a gate opening to the channel portions of the fin structures.

Having described preferred embodiments of a methods and structures for height control in nanosheet devices that are disclosed herein, it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A semiconductor device comprising:

a substrate having a dense array region, an isolation region, and a trench isolation region disposed between and distinct from the dense array region and the isolation region, the trench isolation region comprising a trench extending into the substrate and a dielectric fill disposed in the trench;

a plurality of first fin structures comprised of stacked nanosheets present in the dense array region and separated by a single pitch, wherein the plurality of first fin structures have respective first fin heights measured from an upper surface of the substrate in the dense array region, the respective first fin heights being the same;

at least one second fin structure comprised of stacked nanosheets present in the isolation region, wherein a number of second fin structures in the isolation region is less than a number of first fin structures in the dense array region, the at least one second fin structure having a second fin height measured from an upper surface of the substrate in the isolation region, the second fin height being the same as each of the respective first fin heights;

wherein the plurality of first fin structures further comprise gate structures and source and drain regions; and wherein the stacked nanosheets in the plurality of first fin structures include a first nanosheet having a first silicon and germanium composition and a second nanosheet having a second silicon and germanium composition, wherein a germanium content of the first silicon and germanium composition is different from a germanium content of the second silicon and germanium composition.

2. The semiconductor device of claim 1, wherein the upper surface of the substrate in the dense array region is coplanar with the upper surface of the substrate in the isolation region.

3. The semiconductor device of claim 1, wherein the at least one second fin structure further comprises a gate structure and source and drain regions.

4. The semiconductor device of claim 1, wherein the substrate is composed of silicon.

5. The semiconductor device of claim 1, wherein the trench isolation region is filled with a solid dielectric.

6. An electrical device comprising:

a substrate having a dense array region, an isolation region, and a trench isolation region disposed between and distinct from the dense array region and the isolation region, the trench isolation region comprising a trench extending into the substrate and a dielectric fill disposed in the trench;

a plurality of first field effect transistors having channel regions present in a plurality of first fin structures comprised of stacked nanosheets, the plurality of first fin structures being present in the dense array region and separated by a single pitch, wherein the plurality of first fin structures have respective first fin heights measured from an upper surface of the substrate in the dense array region, the respective first fin heights being the same;

at least one second field effect transistor having channel regions present in at least one second fin structure comprised of stacked nanosheets, the at least one second fin structure being present in the isolation region, wherein a number of second fin structures in the isolation region is less than a number of first fin structures in the dense array region, the at least one second fin structure having a second fin height measured from an upper surface of the substrate in the isolation region, the second fin height being the same as each of the respective first fin heights;

wherein the plurality of first fin structures further comprise gate structures and source and drain regions, and the at least one second fin structure further comprises a gate structure and source and drain regions; and wherein the stacked nanosheets in the plurality of first fin structures include a first nanosheet having a first silicon and germanium composition and a second nanosheet having a second silicon and germanium composition, wherein a germanium content of the first silicon and germanium composition is different from a germanium content of the second silicon and germanium composition.

7. The electrical device of claim 6, wherein the upper surface of the substrate in the dense array region is coplanar with the upper surface of the substrate in the isolation region.

8. The electrical device of claim 6, wherein the substrate is composed of silicon.

9. A semiconductor structure comprising:

a substrate having a dense array region, an isolation region, and a trench isolation region disposed between and distinct from the dense array region and the isolation region, the trench isolation region comprising a trench extending into the substrate and a dielectric fill disposed in the trench;

a plurality of first field effect transistors having channel regions present in a plurality of first fin structures comprised of stacked nanosheets, the plurality of first fin structures being present in the dense array region and separated by a single pitch, wherein the plurality of first fin structures have respective first fin heights measured from an upper surface of the substrate in the dense array region, the respective first fin heights being the same;

at least one second field effect transistor having channel regions present in at least one second fin structure comprised of stacked nanosheets, the at least one second fin structure being present in the isolation region, wherein a number of second fin structures in the isolation region is less than a number of first fin structures in the dense array region, the at least one second fin structure having a second fin height measured from an upper surface of the substrate in the isolation region, the second fin height being the same as each of the respective first fin heights;

wherein substrate portions within the trench isolation region are recessed relative to substrate portions directly underlying the plurality of first fin structures and substrate portions directly underlying the at least one second fin structure to define a step profile of the substrate;

wherein the plurality of first fin structures further comprise gate structures and source and drain regions, and the at least one second fin structure further comprises a gate structure and source and drain regions; and wherein the stacked nanosheets in the plurality of first fin structures include a first nanosheet having a first silicon and germanium composition and a second nanosheet having a second silicon and germanium composition, wherein a germanium content of the first silicon and germanium composition is different from a germanium content of the second silicon and germanium composition.

10. The semiconductor structure of claim 9, wherein only one second fin structure is present in the isolation region.

11. The semiconductor structure of claim 9, wherein the upper surface of the substrate in the dense array region is coplanar with the upper surface of the substrate in the isolation region.

12. The semiconductor structure of claim 9, further comprising additional trenches extending into the substrate between adjacent first fin structures of the plurality of first fin structures, the additional trenches containing additional dielectric fill and being horizontally offset from sidewalls of the adjacent first fin structures.

13. The semiconductor structure of claim 9, wherein an upper surface of the dielectric fill in the trench is recessed relative to the substrate portions directly underlying the plurality of first fin structures and the substrate portions directly underlying the at least one second fin structure.

14. The semiconductor structure of claim 9, wherein the gate structures of the plurality of first fin structures are in direct contact with the channel regions of the plurality of first field effect transistors, and the gate structure of the at least one second fin structure is in direct contact with the channel regions of the at least one second field effect transistor.

15. The semiconductor structure of claim 9, wherein the source and drain regions of the plurality of first fin structures are on opposing sides of the channel regions of the plurality of first field effect transistors, and the source and drain regions of the at least one second fin structure are on opposing sides of the channel regions of the at least one second field effect transistor.

16. The semiconductor structure of claim 9, wherein the gate structures of the plurality of first fin structures and the gate structure of the at least one second fin structure each comprise at least one gate dielectric and at least one gate conductor.

17. The semiconductor structure of claim 9, wherein the source and drain regions of the plurality of first fin structures and the source and drain regions of the at least one second fin structure comprise epitaxial semiconductor material.

18. The semiconductor structure of claim 9, wherein the stacked nanosheets in the plurality of first fin structures comprise alternating nanosheets having the first silicon and germanium composition and nanosheets having the second silicon and germanium composition.

19. The semiconductor structure of claim 9, wherein, in each of the plurality of first fin structures, a bottommost nanosheet having the first silicon and germanium composition is in direct contact with the substrate.

20. The semiconductor structure of claim 9, wherein the dielectric fill is on exposed upper surfaces of the substrate within the step profile and in the trench.

* * * * *